US011658638B2

(12) United States Patent
Green et al.

(10) Patent No.: US 11,658,638 B2
(45) Date of Patent: May 23, 2023

(54) MAGNETOELASTIC RESONATOR AND METHOD OF MANUFACTURING SAME

(71) Applicant: The Regents of the University of Michigan, Ann Arbor, MI (US)

(72) Inventors: Scott R. Green, Maumee, OH (US); Yogesh Gianchandani, Ann Arbor, MI (US); Ramprasad M. Nambisan, Ann Arbor, MI (US); Jiqing Jiang, Mountain View, CA (US)

(73) Assignee: The Regents of the University of Michigan, Ann Arbor, MI (US)

(*) Notice: Subject to any disclaimer, the term of this patent is extended or adjusted under 35 U.S.C. 154(b) by 277 days.

(21) Appl. No.: 17/006,014

(22) Filed: Aug. 28, 2020

(65) Prior Publication Data

US 2021/0067137 A1      Mar. 4, 2021

Related U.S. Application Data

(60) Provisional application No. 62/894,196, filed on Aug. 30, 2019.

(51) Int. Cl.
*H03H 9/22* (2006.01)
*H03H 3/06* (2006.01)

(52) U.S. Cl.
CPC ............... *H03H 9/22* (2013.01); *H03H 3/06* (2013.01)

(58) Field of Classification Search
CPC ....... G08B 13/2408; H03H 2001/0057; H03H 3/013; H03H 3/06; H03H 9/02338; H03H 9/22; H03H 9/2452

USPC ............... 455/575.1, 556.1; 73/779; 333/187
See application file for complete search history.

(56) References Cited

U.S. PATENT DOCUMENTS

| | | | |
|---|---|---|---|
| 4,745,401 A | 5/1988 | Montean | |
| 4,967,185 A | 10/1990 | Montean | |
| 5,083,112 A | 1/1992 | Piotrowski | |
| 6,359,563 B1* | 3/2002 | Herzer | G08B 13/244 |
| | | | 148/108 |
| 7,245,117 B1 | 7/2007 | Joy et al. | |
| 8,456,257 B1* | 6/2013 | Fattinger | H03H 9/02118 |
| | | | 333/187 |
| 10,287,877 B2 | 5/2019 | Gianchandani et al. | |
| 10,921,360 B2* | 2/2021 | Kubena | H04B 17/21 |
| 10,928,539 B2* | 2/2021 | Doany | G01V 3/165 |
| 11,101,786 B1* | 8/2021 | Kubena | H03H 3/02 |
| 2004/0069379 A1* | 4/2004 | Herzer | G08B 13/244 |
| | | | 148/121 |
| 2008/0121313 A1* | 5/2008 | Herzer | G08B 13/244 |
| | | | 148/108 |

(Continued)

FOREIGN PATENT DOCUMENTS

WO      WO2015112996 A1      7/2015

*Primary Examiner* — Tan H Trinh
(74) *Attorney, Agent, or Firm* — Reising Ethington P.C.

(57) ABSTRACT

A resonator comprising a magnetoelastic body having a mass load portion and an active resonating portion can be used in implementations such as a security tag. The resonator includes a mass at the mass load portion of the magnetoelastic body. Displacement of the magnetoelastic body is configured to occur at both the mass load portion and the active resonating portion. A strain at the active resonating portion during displacement is configured to be greater than a strain at the mass load portion during displacement.

19 Claims, 13 Drawing Sheets

(56) References Cited

U.S. PATENT DOCUMENTS

| | | | |
|---|---|---|---|
| 2012/0256522 A1* | 10/2012 | Ito | G01R 33/0052 29/25.35 |
| 2013/0105921 A1* | 5/2013 | Najafi | G01C 19/574 257/E29.324 |
| 2015/0122044 A1* | 5/2015 | Gianchandani | G01L 1/12 73/779 |
| 2018/0372563 A1* | 12/2018 | Rogers | B81B 7/02 |
| 2019/0011599 A1* | 1/2019 | Shoemaker | H01F 1/04 |

* cited by examiner

MAGNETOELASTIC RESONATOR AND METHOD OF MANUFACTURING SAME

CROSS-REFERENCE TO RELATED APPLICATION

This application claims the benefit of U.S. Provisional Application No. 62/894,196 filed Aug. 30, 2019, which is hereby incorporated by reference in its entirety.

GOVERNMENT FUNDING

This invention was made with government support under DK102663 awarded by the National Institutes of Health. The government has certain rights in the invention.

FIELD

This invention relates generally to resonators, and more particularly, to magnetoelastic resonators and methods of manufacturing magnetoelastic resonators.

BACKGROUND

Miniaturization of magnetoelastic resonators is desirable in a number of applications. One drawback of simply reducing the resonator dimensions, however, is that the operating frequency will necessarily increase—making changes to the transmit/receive hardware and signal processing necessary. Accordingly, targeting miniaturization while maintaining the operating resonant frequency can be advantageous.

SUMMARY

In accordance with one embodiment, there is provided a resonator comprising a magnetoelastic body having a mass load portion and an active resonating portion. The resonator includes a mass at the mass load portion of the magnetoelastic body. Displacement of the magnetoelastic body is configured to occur at both the mass load portion and the active resonating portion, and a strain at the active resonating portion during displacement is configured to be greater than a strain at the mass load portion during displacement.

In accordance with another embodiment, the resonator is part of a security tag comprising a housing, and the resonator is not anchored to the housing.

In accordance with another embodiment, there is provided a method of manufacturing a resonator. The method includes the step of correlating a size of a mass with a size of a magnetoelastic body. The size of the mass is at least partially dependent on a miniaturization factor of the magnetoelastic body. The method also includes the step of coupling the mass to the magnetoelastic body at a mass load portion of the magnetoelastic body.

DRAWINGS

Example embodiments will hereinafter be described in conjunction with the appended drawings, wherein like designations denote like elements, and wherein.

DESCRIPTION

A magnetoelastic resonator is described herein that is capable of being miniaturized while maintaining a desired resonant frequency. Scaling effects for ribbon magnetoelastic resonators were examined, and it was shown that simply reducing the sensor length has a substantial impact on both the resonant frequency and the size of the received signal. The presently disclosed resonators and methods of manufacturing the resonators can miniaturize the magnetoelastic body while maintaining the resonant frequency.

This miniaturization while maintaining the resonant frequency can be advantageous in a number of applications, one of which being anti-theft tags. Currently, magnetoelastic (sometimes referred to as acoustomagnetic) tags or resonators are used in electronic articles surveillance (EAS) applications in very high volumes. This application is also known as an "anti-theft" application. The EAS tags typically consist of a magnetoelastic strip or body, sometimes two or three strips stacked on each other, that are about 5 mm wide by 37.5 mm long. The EAS tags further include a separate ferromagnetic strip that is used to apply a DC bias that can be turned "on" or "off" at the register by the cashier. These strips are kept in a polymeric package or housing, and the package is adhered to the retail article. The EAS tags work in conjunction with security stations located at the exits of the retailers. These stations consist of coils and electronic circuitry that is meant to constantly generate pulses of magnetic fields and "listen" for a response at the characteristic resonant frequency of the tags, which is 58 kHz. This low frequency (relative to the greater than 1 MHz of RF anti-theft tags) has the advantage of being able to better penetrate metals, such as shopping carts or metal retail items.

Because the operating frequency of the security stations for the EAS security tags cannot be changed over a wide range, and the infrastructure of the security stations is already widespread, any new tag designs should preferably operate at nearly the same frequency of 58 kHz. The presently disclosed magnetoelastic resonators allow for miniaturization of security tags while maintaining this same operating frequency. This allows the already-placed security station infrastructure to remain in place and continue to be utilized, while also enabling the tagging of smaller retail items, making the tags more discrete to reduce the effect of the tag on the branding and packaging of the item, or simply reducing the material cost of each tag.

Mass-Loaded Magnetoelastic Resonators—

Figure 1:
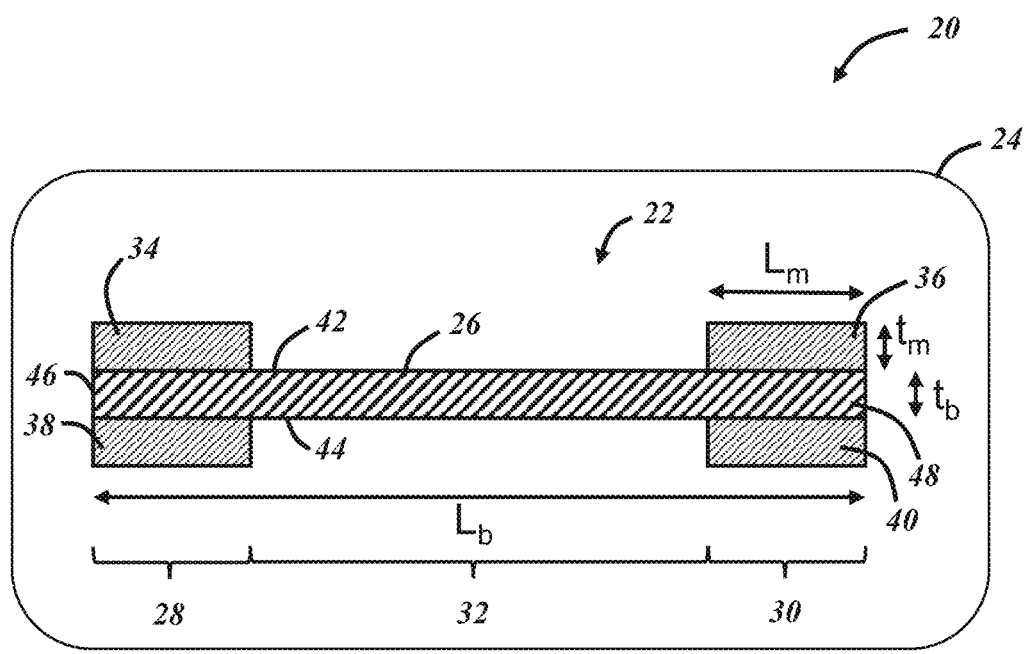
FIG. 1 is a cross-sectional schematic view of a resonator in accordance with one embodiment.

FIG. 1 schematically illustrates a cross-sectional view of a security tag 20 having a magnetoelastic resonator 22. The magnetoelastic resonator 22 is shown in a schematic housing 24, which may vary in size and/or shape from what is illustrated. The housing 24 is typically a polymeric clam-shaped style housing, in which the resonator 22 is able to freely move within. In other words, the resonator 22 is not anchored to any portion of the housing 24 or another structure. Using the scaling methods described herein, the size of the resonator 22, and accordingly, the size of the housing 24, can be decreased while maintaining performance capabilities and the capacity to work within the already-present security infrastructure. This allows the tag 20 and resonator 22 to advantageously be used in a wider array of applications than more standard sized tags.

The magnetoelastic resonator 22 includes a magnetoelastic body 26 having a first mass load portion 28 and a second mass load portion 30 with an active resonating portion 32 located between the two mass load portions 28, 30. Given that the resonator 22 is not anchored, displacement of the magnetoelastic body 26 is configured to occur at both the mass load portions 28, 30 and the active resonating portion 32. A small anchor, or set of anchors, could be located at the mid-length of the active resonating portion 32 while achieving the same general displacement and strain distributions described herein. The perspective views of the resonator 22 embodiments illustrated in FIGS. 2 and 3 also illustrate the various portions 28, 30, 32 of the magnetoelastic body 26. In FIG. 1, there is a first mass 34, a second mass 36, a third mass 38, and a fourth mass 40. The first mass 34 and the second mass 36 are located on a first or top side 42 of the body 26, while the third mass 38 and the fourth mass 40 are located on a second or bottom side 44 of the body 26. The first mass 34 and the third mass 38 are located at a first end 46 of the body 26, while the second mass 36 and the fourth mass 40 are located at a second end 48 of the body 26. The first or top side 42 is situated opposite from, or is opposed to, the second or bottom side 44 with respect to a thickness $t_b$ of the ribbon-shaped body 26. The first end 46 is situated opposite from the second end 46 along the length $L_b$ of the ribbon-shaped body 26. In some embodiments, the masses 34-40 are symmetrically distributed with respect to the body 26. Given the additional mass at the mass load portions 28, 30, the strain at the active resonating portion 32 is greater during displacement of the resonator body 26, as compared with the strain at each of the mass load portions 28, 30 during displacement.

Figure 2:
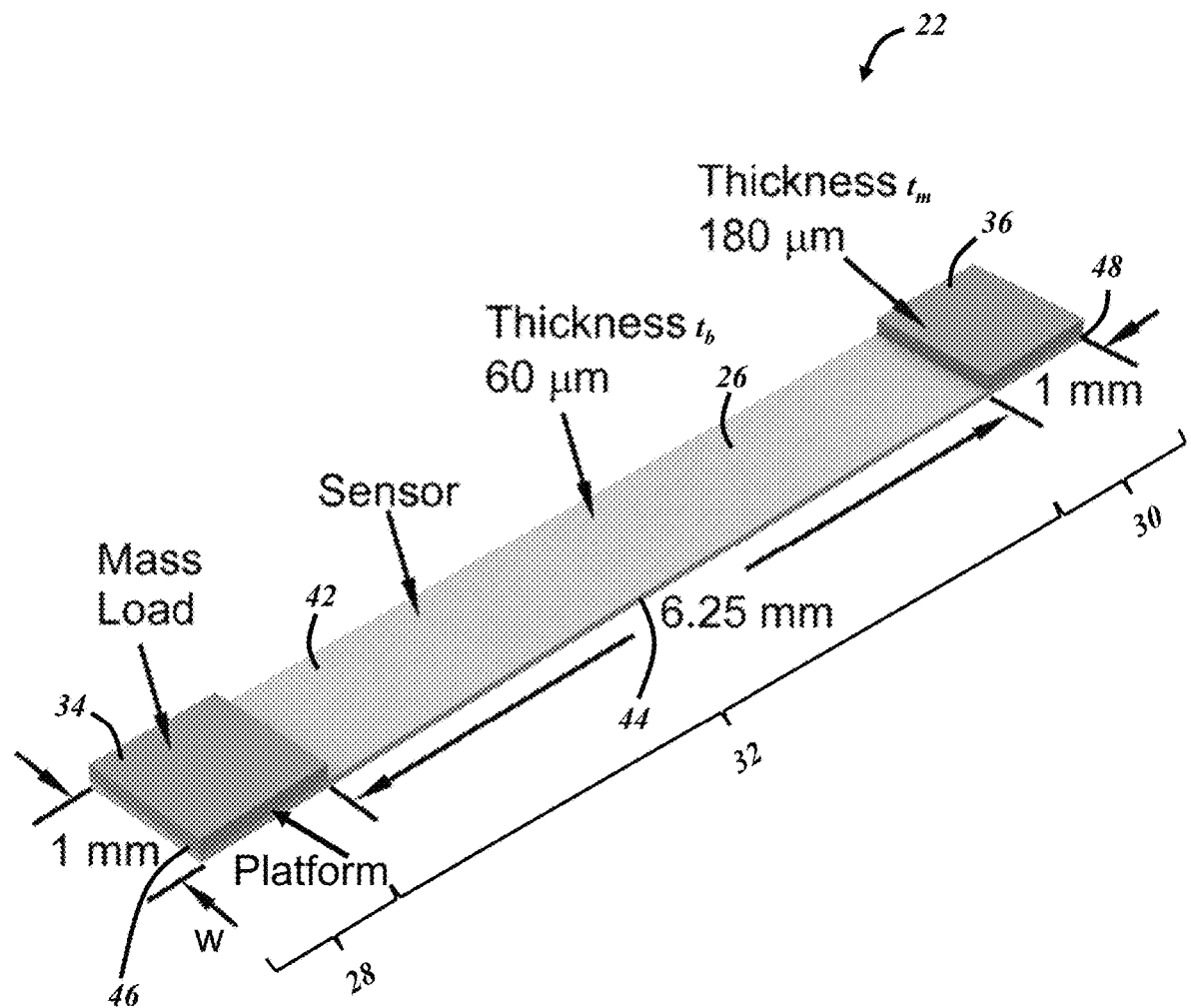
FIG. 2 is a perspective view of a resonator in accordance with another embodiment.
Figure 3:
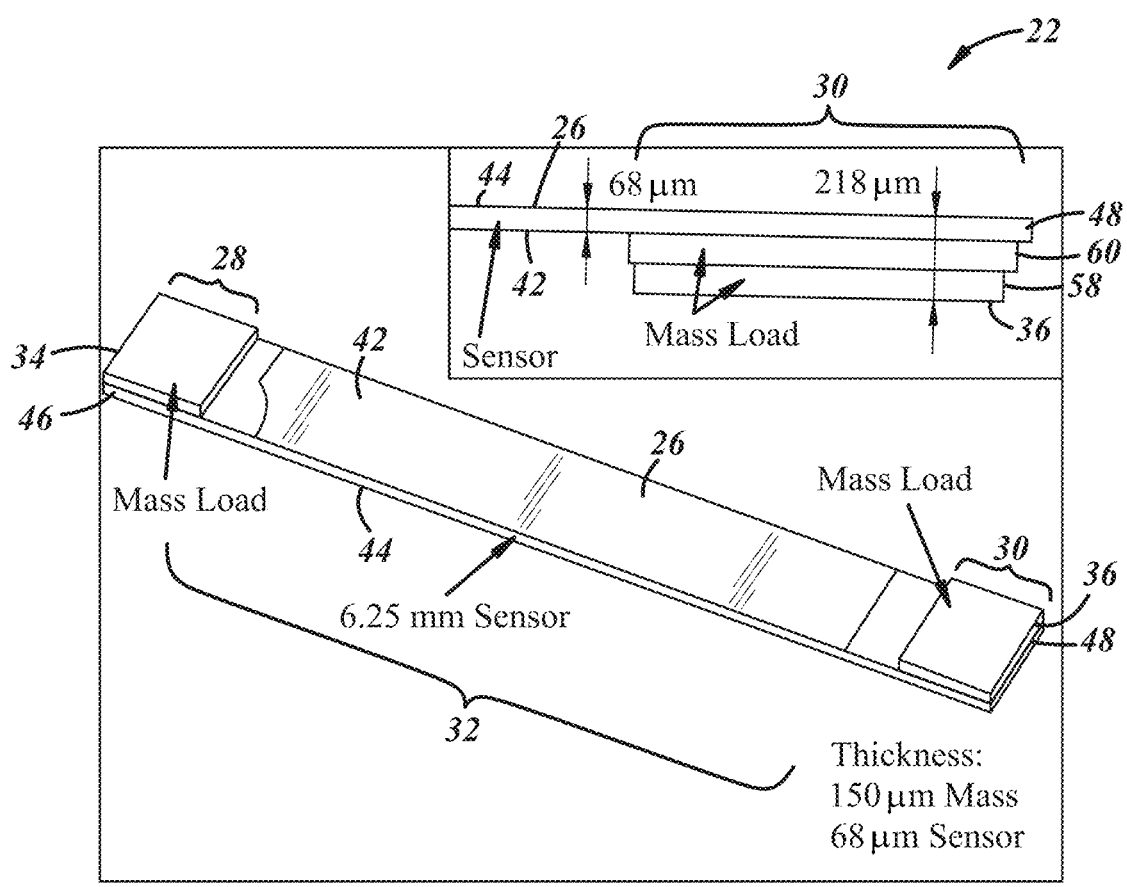
FIG. 3 shows a manufactured resonator in accordance with one embodiment.
Figure 5:
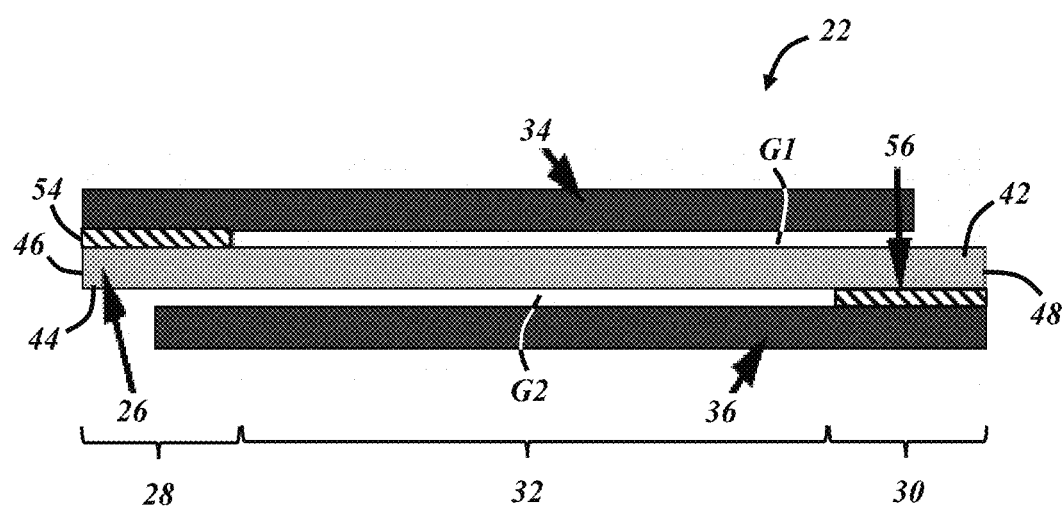
FIG. 5 is a side schematic view of a resonator in accordance with another embodiment.
Figure 6:
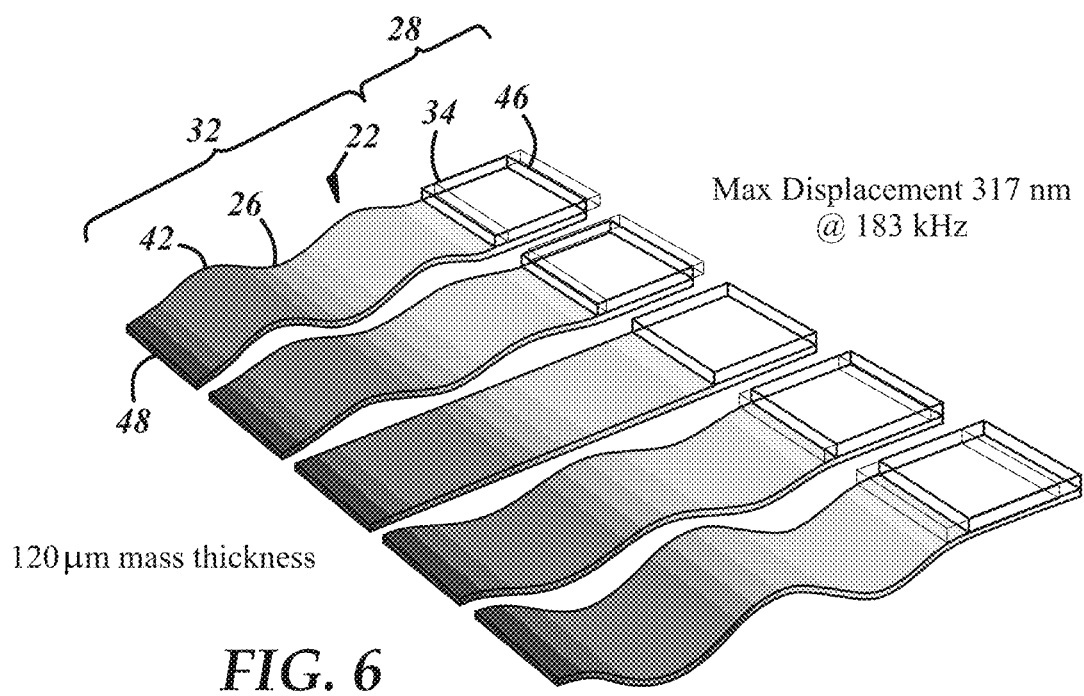
FIG. 6 shows simulated displacement of a resonator having a 120 μm mass portion thickness.
Figure 7:
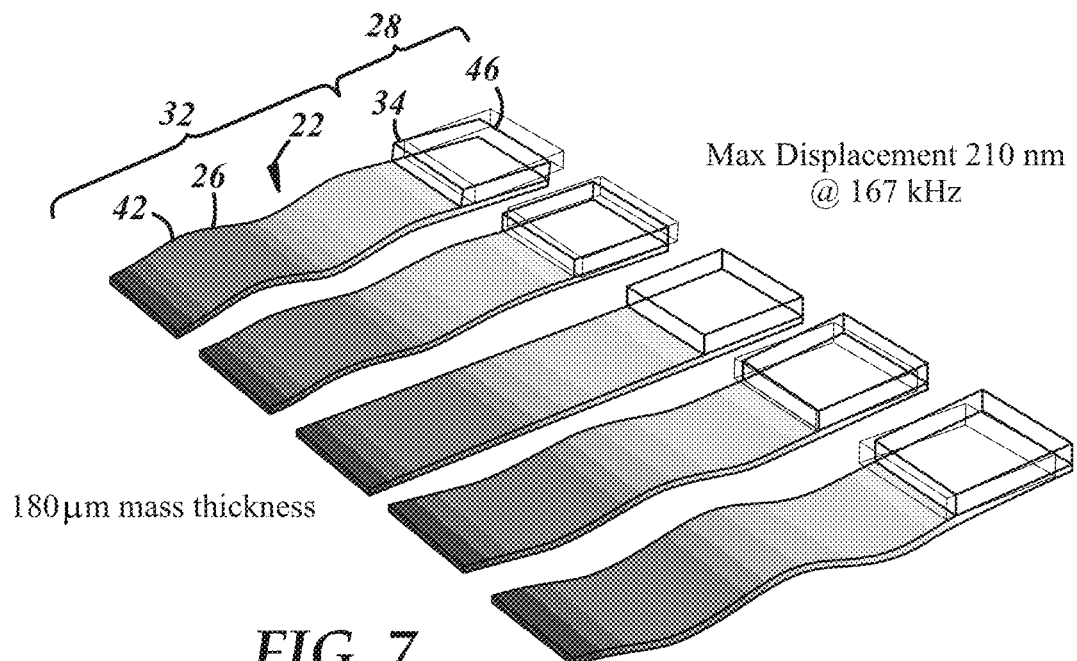
FIG. 7 shows simulated displacement of a resonator having a 180 μm mass portion thickness.

In the embodiments illustrated in FIGS. 1-7 each mass (34-40 in FIG. 1; 34, 36 in FIGS. 2-5; 34 in FIGS. 6 and 7) is a separate mass element attached to or otherwise coupled with the magnetoelastic body 26. In the embodiment of FIG. 1, there are four separate masses or mass elements 34-40. In the embodiments of FIGS. 2 and 3, there are two separate masses or mass elements 34, 36 which are located at the first and second ends 46, 48, respectively, of the body 26, with both masses 34, 36 being located on a first or top side 42. In the embodiment illustrated in FIG. 4, there are two separate masses or mass elements 34, 36, each of which extend through an anchoring perforation 50, 52, respectively, at each of the ends 46, 48. In this embodiment, each mass 34, 36 has a portion that is located on both the first or top side 42 and the second or bottom side 44. In FIG. 5, each mass 34, 36 is coupled to the mass load portion 28, 30 via a separate joint portion 54, 56. In this embodiment, the masses 34, 36 extend longitudinally toward the opposite end 46, 48 to which it is attached. In some embodiments not particularly illustrated, the masses 34-40 could extend transversely instead of, or in addition to, the longitudinal extension. In the FIG. 5 embodiment, rather than being constrained to the same footprint as the joining area or joint 54, 56 at each mass load portion 28, 30, the masses 34, 36 extend above the length of the main resonator and create gaps $G_1$ and $G_2$ between the masses 34, 36 and the active resonating portion 32 of the body 26. In FIGS. 6 and 7, there is only one separate mass or mass element 34 located on the first or top side 42 at the first end 46. FIGS. 6 and 7 illustrate COMSOL simulations of the displacement of the resonator 22, and accordingly, only one of the resonators 22 in each of FIGS. 6 and 7 is labeled for clarity purposes. Advantageously, the masses 34-40 are located as far toward the respective ends 46, 48 as possible.

The masses 34-40 can, in some embodiments, be permanent magnets to provide a DC magnetic bias, which may provide for a large amplitude response from the resonator 22. In one embodiment, the masses 34-40 are made from an iron-based material, such as a nickel-iron alloy or ARNOKROME 5. Other materials are certainly possible, including non-magnetic materials, depending on the desired implementation. As shown in the inset in FIG. 3, it is possible for the masses, such as mass 36, to have a plurality of mass layers 58, 60. In some embodiments, the masses 34-40 are adhered or otherwise coupled or integrated with the body 26. In one particular embodiment, the masses 34-40 are solder-bonded, and may form a separate joint portion 54, 56, as schematically illustrated in FIG. 5.

The magnetoelastic body 26 is advantageously a ribbon-shaped body having a length $L_b$ that is several times greater than its thickness $t_b$. The length of the active resonating portion 32 can be 35-85% less than the average length (e.g., about 35 mm) of a standard resonator for a security tag, while maintaining a comparable resonant frequency. The magnetoelastic material for the body 26 is METGLAS 2826 in one advantageous embodiment, but other alloys from METGLAS are possible, as are other materials, including but not limited to rare earth metals such as TERFENOL or GALFENOL. In some embodiments, the body 26 comprises a plurality of layers of magnetoelastic material (e.g., two or more).

The magnetoelastic body 26 and/or the masses 34-40 can also have other features not particularly shown herein, such as a thin film coating, to cite one example. A thin film, made from ceramic (e.g., alumina $Al_2O_3$), metal (e.g., titanium Ti), a polymer (e.g., PARYLENE), or some combination thereof, can be used to protect the body 26 and/or the masses 34-40. In addition, the properties of the coating, its thickness, and the deposition parameters (e.g., temperature and deposition rate), can be controlled to add a compressive or tensile residual stress to the underlying magnetoelastic body 26. This residual stress can be used to tailor the resonant frequency, individually or in combination with the structural variations described herein.

The structural properties of the resonator 22 can be optimized to reduce the length $L_b$ of the body 26 while maintaining a particular resonant frequency. Correlating the size of the mass or masses 34-40 with the size of the magnetoelastic body 26 is advantageous. In one embodiment, the size of the mass or masses 34-40 is at least partially dependent on a mass add ratio ($M_{add}/M_0$, where:

$$M_{add}=4*t_m*L_m*w*\rho \quad \text{(Equation 1)}$$

and $$M_0=t_b*L_b*w*\rho \quad \text{(Equation 2)}$$

wherein $t_m$ is a thickness of the mass 3440, $L_m$ is a length of the mass 34-40, $t_b$ is a thickness of the body 26, $L_b$ is a length of the body 26 (see e.g., FIG. 1), w is a width of the mass 34-40 (see e.g., FIG. 2), and $\rho$ is a density of the magnetoelastic body 26.

With the representative geometry illustrated in FIG. 1 and Equations 1 and 2 as guides, (with, e.g., the density $\rho$ being 7900 kg/m³ and the width w being 5 mm), and with the objective of keeping the resonant frequency the same, finite element simulations were performed in which the length of the body $L_b$ was reduced by adding an appropriate amount of mass. The results are shown in Table 1, below. In this example, the size of the mass or masses 34-40 is at least partially dependent on a miniaturization factor of the magnetoelastic body 26, with the miniaturization factor equaling a length $L_{b0}$ of an unloaded magnetoelastic body configured to have an unloaded resonant frequency, divided by a length $L_b$ of the magnetoelastic body 26 configured to have a resonant frequency that is the same as the unloaded resonant frequency (e.g., a loaded resonant frequency versus an unloaded resonant frequency). As the miniaturization factor (length of the original structure divided by the length of the mass loaded structure) increases, the mass 34-40 must become thicker and/or consume more of the total area of the body 26. This typically leaves a smaller active resonating portion 32, which is more elastically deforming than the mass load portions 28, 30. Miniaturization factors larger than those listed in Table 1 are theoretically achievable, although concern should be given so as to avoid penalties to the achievable signal.

TABLE 1

| $L_b$ (mm) | $t_m$ (µm) | $L_m$ (mm) | $M_{add}$ (mg) | $M_{add}/M_0$ | $F_{resonant}$ (kHz) | Miniaturization factor ($L_{b0}/L_b$) |
|---|---|---|---|---|---|---|
| 37.5 ($L_{b0}$) | — | — | — | — | 54.9 | 1 |
| 24.75 | 36 | 3 | 17.1 | 0.46 | 55.3 | 1.52 |
| 13 | 150 | 3 | 71.1 | 1.92 | 55.55 | 2.88 |
| 9 | 340 | 2 | 107.4 | 2.90 | 55.5 | 4.17 |

Though the results in Table 1 are presented in the context of discrete added mass elements, as illustrated, for example in FIGS. 1-7, similar miniaturization factors could be achieved in the other embodiments which are detailed below (see e.g., FIGS. 11-14). In these embodiments, the miniaturization factor is in a range from about 1.5 to about 4.2, inclusive. However, as described, theoretically, larger miniaturization factors are possible. As the miniaturization factor increases, as illustrated in the results in Table 1, a thickness $t_m$ of the mass increases, or in some embodiments, an area of the mass load portion 28, 30 increases. In some embodiments, the miniaturization factor is at least partially dependent on a width of the active resonating portion 32 and a width of the mass, which may be equal (see e.g., w in FIG. 2). As shown in the illustrated implementation of FIG. 2, the width of the mass 34, 36 is equal to a width of its respective mass load portion 28, 30. Table 1 also illustrates that the unloaded resonant frequency (54.9 kHz) is the same as, or similar to (i.e., is within 1 kHz), the loaded resonant frequency (55.3-55.55 kHz). This allows for the resonant frequency of the resonator 22 to be between about 50 and 60 kHz, inclusive, while having a length $L_b$ that is much less than an unloaded resonator length $L_{b0}$. In one particular embodiment, illustrated in FIG. 2, the length of the active resonating portion 32 is only half of the length (6.25 mm) as compared to an unloaded resonator, while maintaining a similar or the same resonant frequency. In some advantageous embodiments of the resonator 22, the length $L_b$ of the magnetoelastic body 26 is in a range from about 8.25 mm to 12.5 mm, inclusive. These lengths were not achievable in previous designs, if a resonant frequency between about 50 and 60 kHz was desired. Further in FIG. 2, the width w is about 1 mm and the thickness of the body $t_b$ is about 60 µm. The masses 34, 36 have a geometry of about 1 mm×1 mm×180 µm.

In creating the analytical model schematically illustrated in FIG. 2, a number of factors were considered. For example, the fundamental frequency $\omega_0$ of longitudinal vibrations for a free-free beam or body with length $L_{b0}$, Young's modulus E, and density of $\rho_s$ is:

$$\omega_0 = \frac{\pi}{L_0}\sqrt{\frac{E}{\rho_s}} \text{ (rad}/s) \quad \text{(Equation 3)}$$

while for a mass-loaded/mass-loaded body 26 with length $L_b$, cross-sectional area S and mass M, the fundamental frequency $\omega_1$ is $$\omega_1 L_1 \sqrt{\frac{\rho_s}{E}} \cdot \tan\left(\frac{\omega_1 L_1}{2}\sqrt{\frac{\rho_s}{E}}\right) = \frac{S\rho_s L_1}{M} \quad \text{(Equation 4)}$$

Let $L_b=\frac{1}{2} L_{b0}$. For the resonant frequency of the unloaded and loaded resonator 22 to be equal, $\omega_1=\omega_0$, and $$M = \frac{2}{\pi}S\rho L_1 \quad \text{(Equation 5)}$$

This means with the proper mass loadings $$\left(\frac{2}{\pi} \text{ times the original beam mass}\right)$$

at both ends, the body can vibrate at the same frequency of the free-free unloaded structure but while only occupying half of the length. In this example, the structure of the mass-loaded resonator 22 has two point-masses 34, 36 with the dimensions illustrated in FIG. 2.

Analysis of Unloaded Resonators—

To better understand the scaling of the resonators 22, ribbon-shaped magnetoelastic bodies with various lengths were simulated in COMSOL. The width and thickness of the sensors were fixed to be 1 mm and 60 µm, respectively, while the lengths of the active resonating portions resonators were 12.5 mm, 9.375 mm, and 6.25 mm. The quality factors of all the resonators were set to be 600 by setting the equivalent mass loading $\alpha_m=\omega_r/Q$ in the Rayleigh damping model, where $\omega_r$ is the resonant frequency and Q is the quality factor. The simulated coil was 5 mm in radius and 30 mm in length, and the surface current density was 22.29 A/m (directed azimuthally around the coil) to generate an input magnetic flux density of 0.28 G along the longitudinal axis of the coil. The signal amplitude was calculated with Faraday's law of induction, by first evaluating the volume integration of the rate of change of the magnetic flux density in the axial direction of the coil and resonator at resonance, then subtracting the value calculated in the same manner without the presence of a resonator. This process, in effect, cancelled the large transmitted signal from manifesting in the response signal.

The calculated resonant frequencies, resonator tip or end displacements, and signal amplitudes are listed below in Table 2. The simulation results show that the resonant frequency of the resonator is inversely proportional to the body length, which matches the classical beam theory for the longitudinal vibration mode. The signal amplitude of the resonator reduces roughly proportionally with the decreasing length (reducing the body length by half reduces the signal amplitude by 62%).

TABLE 2

COMSOL simulation result of the magnetoelastic ribbon resonators of different lengths with the same width (1 mm), same thickness (60 μm), and similar quality factor (~600).

| Resonator Body Length (mm) | Resonant Frequency (kHz) | Tip Displacement (nm) | Signal Amplitude ($\times 10^{-4}$ Vm/turn) |
|---|---|---|---|
| 12.5 | 165.75 | 850 | 1.95 |
| 9.375 | 221.95 | 425 | 1.23 |
| 6.25 | 334.40 | 202 | 0.74 |

Fabricated double-layer magnetoelastic resonators with the same dimensions as those modeled (two samples for each case) were also tested experimentally. The DC magnetic field generated by Helmholtz coils was tuned to the optimal magnetic bias for the highest SNR. The averaged test results from two samples of each sensor length are shown in Table 3. From the benchtop experiment results, the signal energy of 6.25 mm long resonator was only 6.4% of that of the 12.5 mm long resonator.

TABLE 3

Benchtop experiment results of the fabricated double-layer magnetoelastic ribbon resonators of different lengths with the same width (1 mm) and thickness (60 μm).

| Resonator Body Length (mm) | Signal Energy ($V^2$) | Normalized Energy (%) | SNR ($\times 10^5$) | Resonant Frequency (kHz) | Quality Factor |
|---|---|---|---|---|---|
| 12.5 | 0.717 | 100% | 28.4 | 159.72 | 483.5 |
| 9.375 | 0.118 | 12% | 2.9 | 214.35 | 431.4 |
| 6.25 | 0.046 | 3.2% | 0.9 | 321.40 | 555.4 |

The normalized SNR and resonant frequency of the above three resonator types, along with single-layer magnetoelastic resonators (28 μm thick) with two different widths (0.5 mm and 1 mm) were also fabricated and tested to plot a more general scaling effect. This showed that the resonant frequency is inversely proportional to the body length, and is not as strongly related to the width or thickness, as expected. Also, the resonator signal tends to decrease rapidly when any dimension is reduced. In all cases, the quality factors were around 250 to 700. The DC bias field was approximately 10 Oe, 10 Oe, and 23 Oe for the 12.5 mm, 9.375 mm, and 6.25 mm long bodies, respectively.

The simulation and experimental results of Tables 2 and 3 differ significantly, but for a reason that is more likely related to the practical concerns of the experimental measurements. After adjusting for these effects, the finite element analysis (FEA) results and the experimental results are compared in Table 4. The raw and adjusted energies of the FEA and experimental results are the relative values of the 12.5 mm long body in all cases.

TABLE 4

The resonant frequencies, quality factors, time constants, and relative signal energies of both FEA and experimental results are compared.

| Resonator Body Length (mm) | 12.5 | 9.375 | 6.25 |
|---|---|---|---|
| FEA Resonant Frequency (kHz) | 165.75 | 221.95 | 334.40 |
| FEA Quality Factor | 554 | 551 | 548 |
| FEA Time Constant (ms) | 1.15 | 0.86 | 0.57 |
| FEA Raw Energy (%) | 100% | 30% | 7.1% |
| FEA Adjusted Energy (%) | 100% | 17% | 2.6% |
| Experimental Resonant Frequency (kHz) | 159.72 | 214.35 | 321.40 |
| Experimental Quality Factor | 484 | 431 | 555 |
| Experimental Time Constant (ms) | 0.96 | 0.64 | 0.54 |
| Experimental Measured Energy (%) | 100% | 12% | 3.2% |

Adjusting the simulation results to account for the practical experimental effects results in an excellent match between the simulated and experimental scaling of received energy.

Analysis of Mass-Loaded Resonators—

A fully coupled magnetomechanical model was also simulated in COMSOL, along with FEA of the magnetic DC bias, as shown in FIGS. 6-9. The masses were simulated as iron blocks and have the same mass density as the body (Metglas 2826 MB in this particular example). The simulated coil was 5 mm in diameter and 30 mm in length, and its surface current density was 22.29 A/m (directed in the azimuthal direction of the coil) to provide a 0.28 G AC magnetic flux density.

The simulation result, as shown in FIGS. 6 and 7, indicates that the vibration mode of the resonators 22 is at the resonant frequencies of 183 kHz (FIG. 6) and 167 kHz (FIG. 7), with 120 μm and 180 μm mass thicknesses, respectively. Symmetry across the mid-length of each body 26 was used in the simulation. Because of the masses 34 having a center of mass above the neutral axis of the body 26, the resonator 22 has a small amount of out-of-plane displacement even when vibrating in its fundamental longitudinal mode. The maximum displacement amplitude of the resonators 22 at the ends 48 along the longitudinal sensor axis are simulated as 317 nm and 210 nm, respectively. The simulated signal amplitudes of the resonators 22 are $1.37 \times 10^{-4}$ Vm/turn and $1.28 \times 10^{-4}$ Vm/turn, respectively, which are around 70% of that of the 12.5 mm long ribbon body (49% of the signal energy of the 12.5 mm long ribbon body).

Figure 9:
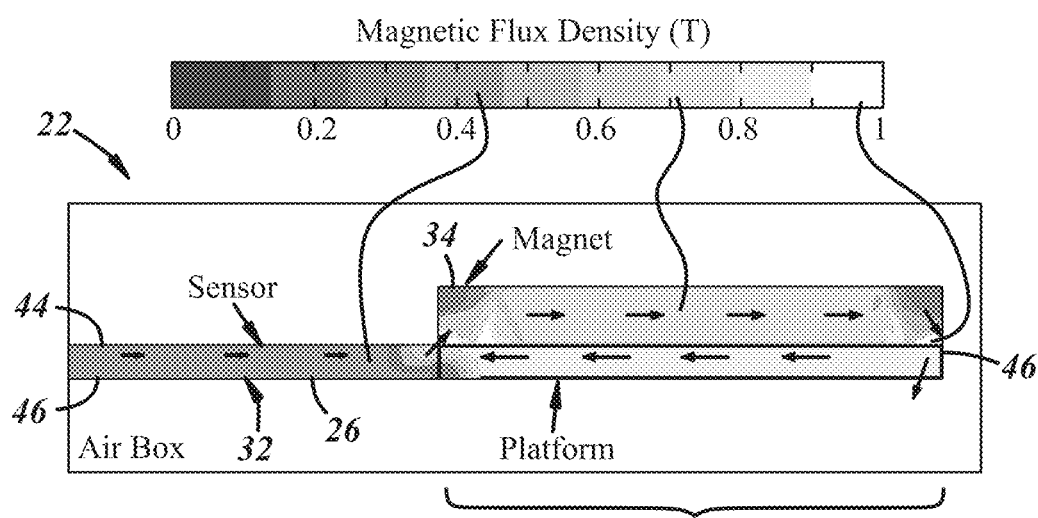
FIG. 9 shows simulated magnetic flux density for a resonator in accordance with one embodiment.
Figure 4:
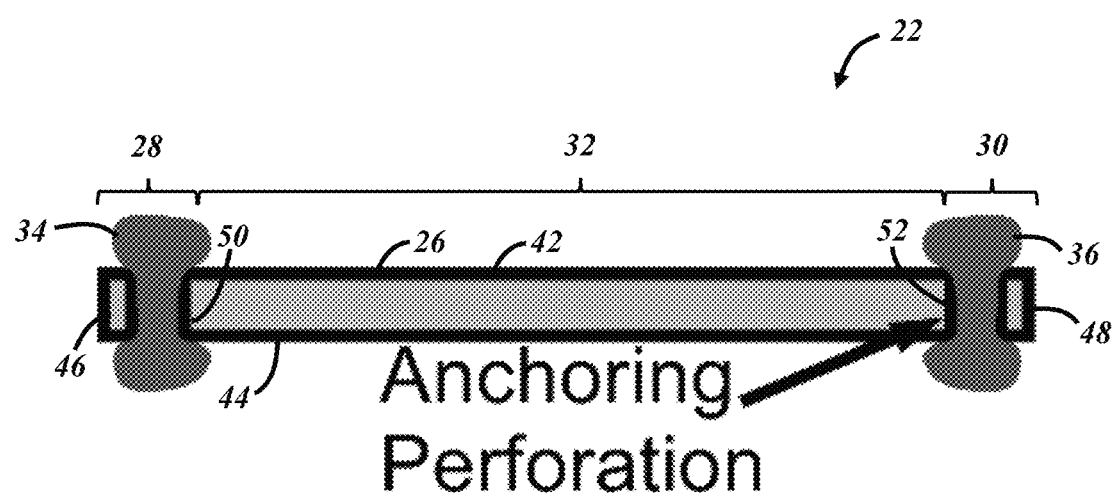
FIG. 4 is a cross-sectional schematic view of a resonator in accordance with another embodiment.
Figure 8:
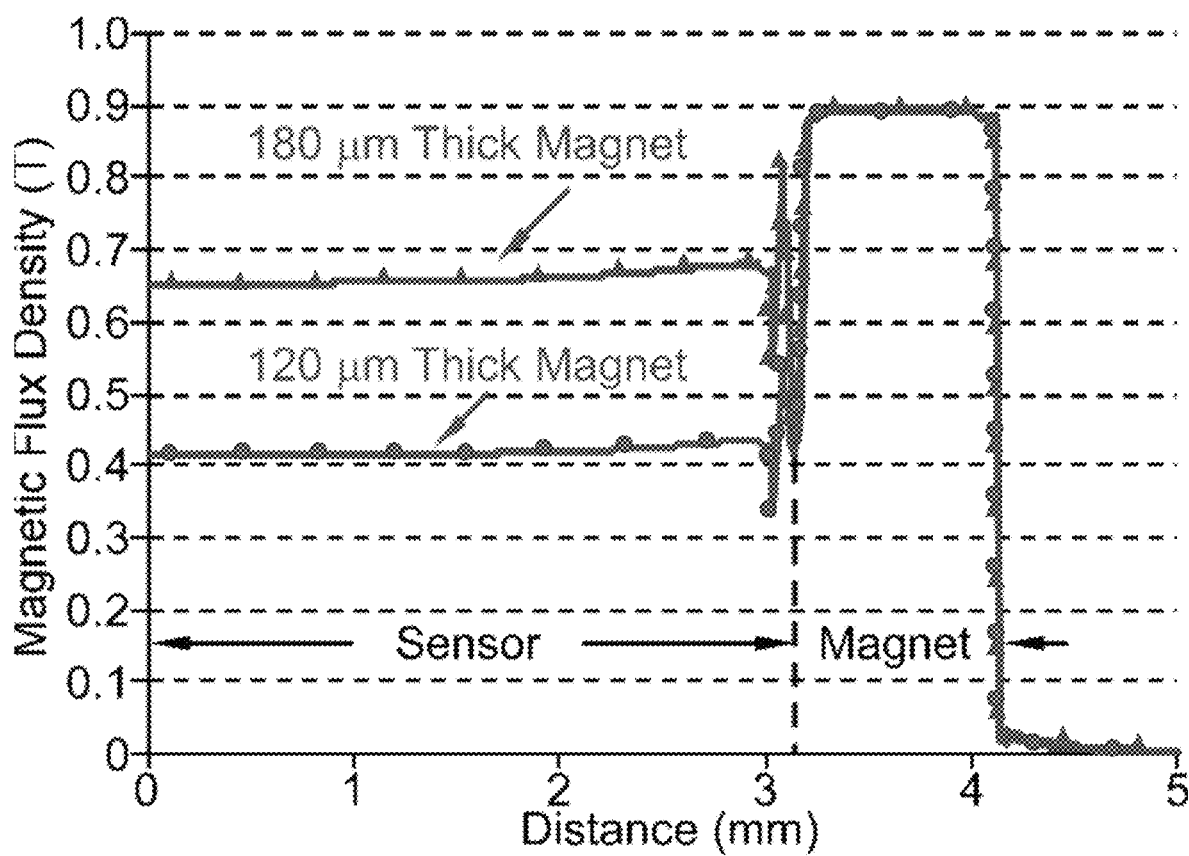
FIG. 8 is a graph of the magnetic flux density for the simulated resonators of FIGS. 6 and 7.

For some implementations, as described above, the masses 34-40 of the resonator 22 are intended to be permanent magnets to provide a DC magnetic field for biasing the resonator. To estimate the approximate DC magnetic flux density that could be generated in the resonator for such an architecture, finite element analysis in COMSOL was utilized. In the COMSOL simulations, the magnets have the thickness of 120 μm or 180 μm and are set to have a residual flux density of 0.9356 T (along the longitudinal axis of the resonator) and a relative permeability of 23. These are approximate values of ARNOKROME 5 material, which can be used in the construction of the resonator 22. The non-linear magnetization saturation behavior of the magnetoelastic material was considered in the model by setting the sensor material B-H curve to have a saturation induction of 0.88 T at 14 A/m (50000 DC relative permeability). Modeling this behavior allows the model to avoid unrealistic shunting of the magnetic field through the highly permeable magnetoelastic material directly beneath the magnetic masses (i.e., at the mass load portion 32). The simulated magnetic flux density was found to be uniform in the resonator with values of 0.4 T and 0.65 T, for the 120 μm thick and 180 μm thick magnets, respectively, as shown in FIG. 8. FIG. 9 shows the simulated magnetic flux density magnitude and direction in the body 26 and magnet. These are similar to bias flux densities from non-integrated magnetic sources used in previous work, indicating that the magnet masses should provide sufficient DC bias to allow a significantly large resonator response.

Figure 10:
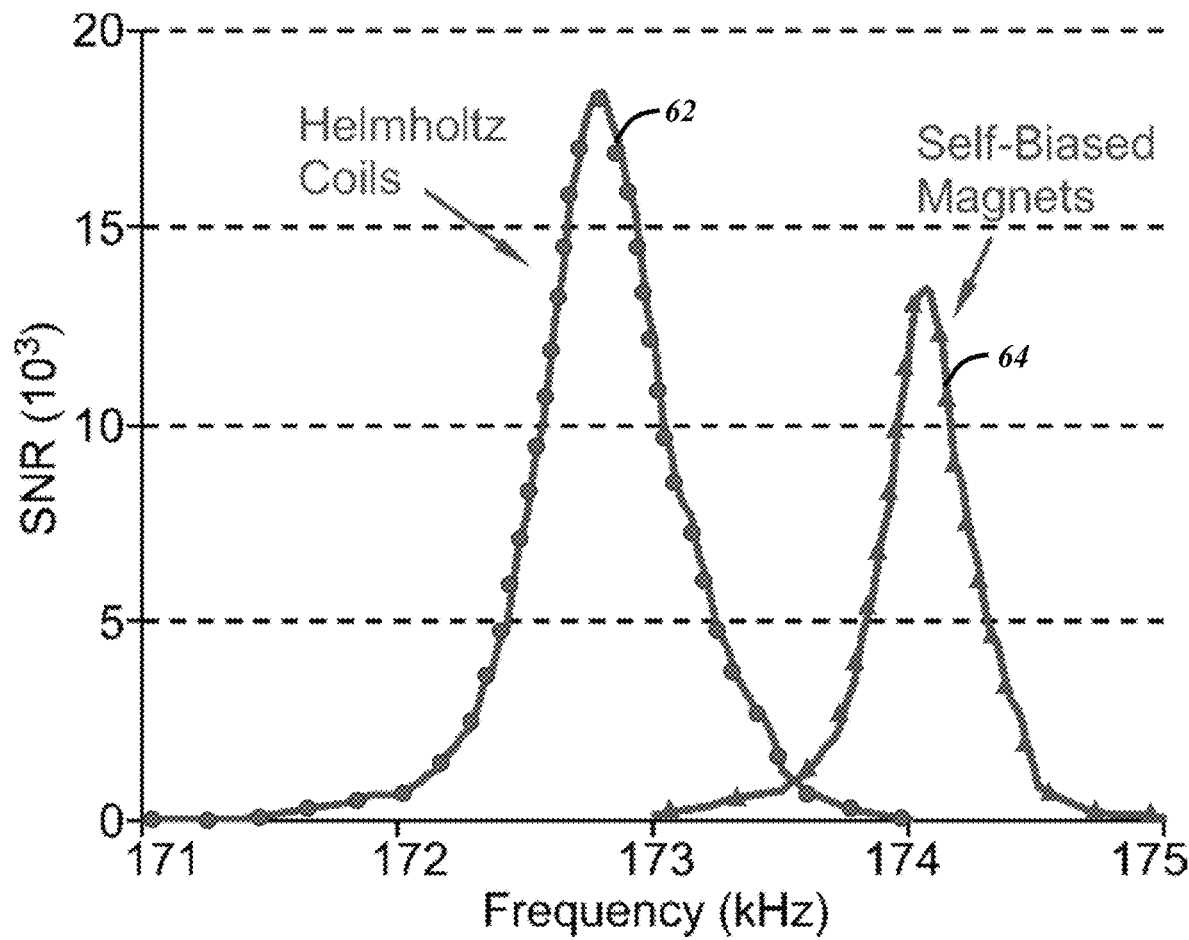
FIG. 10 is a graph comparing the signal-to-noise ratio of Helmholtz coils and magnetized mass portions of resonators in accordance with one or more embodiments.

Additionally, two mass-loaded resonators 22 having permanent magnets as the masses 34, 36 were fabricated and first tested in Helmholtz coils to find the largest signal at the optimal bias point. One of these resonators 22 is pictured in FIG. 3. The average resonant frequency, signal energy, SNR, and the quality factor are 172.03 kHz, 0.007 $V^2$, 18280, and 296, respectively, when the biasing field was 10 Oe (provided by Helmholtz coils). The magnets were then magnetized using an impulse magnetizer (10 kG peak magnetic flux density). The self-biased resonators 22 were tested in the 30 mm diameter small coil set. Bandpass filtering was not engaged on the LNA. The peak input current during the transmit period was set to 43 mA. The average resonant frequency, signal energy, SNR, and the quality factor are 173.6 kHz, 0.006 $V^2$, 13888, and 385, respectively. FIG. 10 shows the frequency response 62 of a typical resonator that is biased by Helmholtz coils and a frequency response 64 of a resonator 22 that is biased by magnet for the masses, respectively. Thus, the self-biased magnets as masses 34, 36 can provide a near-optimal DC magnetic bias for the resonator 22. The mass-loaded resonator 22 had a similar level of SNR to that of the 6.25 mm long, 1 mm wide, and 60 μm thick ribbon body, but its resonant frequency was similar to that of a 12.5 mm long ribbon body and still maintained a fairly high quality factor.

Additional Mass-Loaded Resonator Embodiments—

Figure 11:
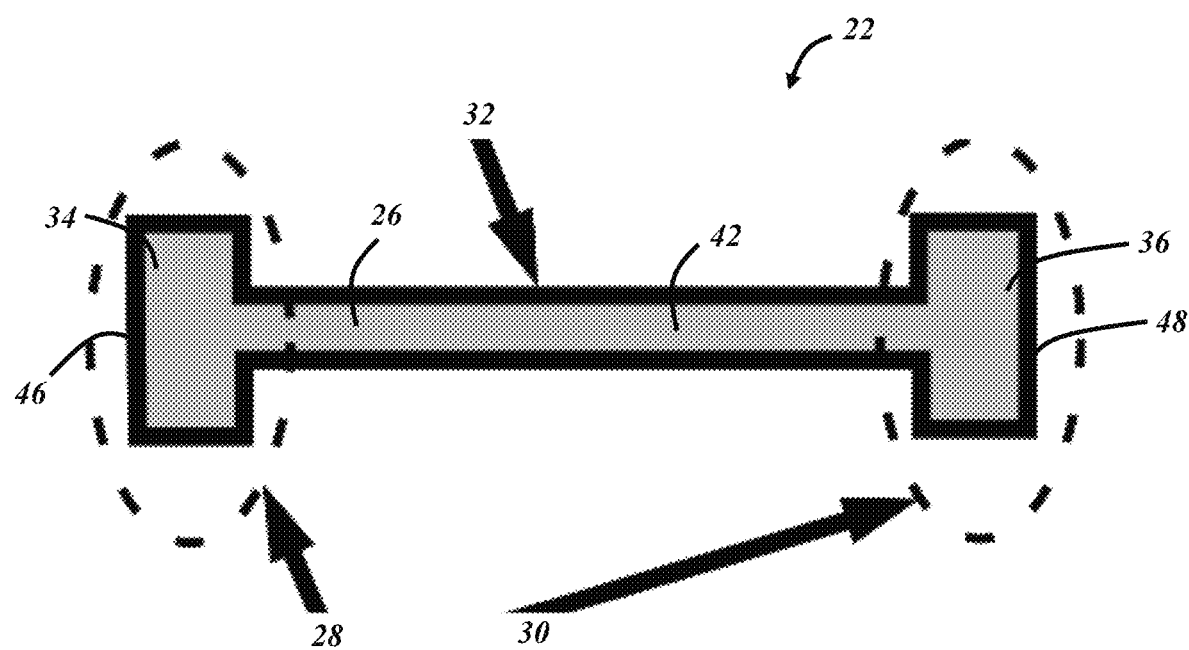
FIG. 11 is a top view of another embodiment of a resonator.

Turning to FIGS. 11-14, in these embodiments, the masses 34, 36 are not separate mass elements as with the embodiments illustrated in FIGS. 1-7. Instead, the rectangular geometry (where the length dimension $L_b$ is greater than the width dimension w) of the resonator 22 is tailored to achieve an effective mass load. In FIG. 11, the mass load portions 28, 30 are widened as compared with the narrower active resonating portion 32. This abrupt change in cross-sectional area at the ends 46, 48 and at each mass load portion 28, 30, creates an acoustic impedance mismatch at that abrupt change, resulting in elastic waves (and thus the vast majority of the strain energy contributing to the magnetoelastic response) being contained in the narrower active resonating portion 32 of the resonator, while the wider mass load portions 28, 30 act to provide an effective mass load to the resonating portion 32 and thus reduce the resonant frequency (the ends may be two or three times wider than the active resonating portion, to cite a few examples).

Figure 12:
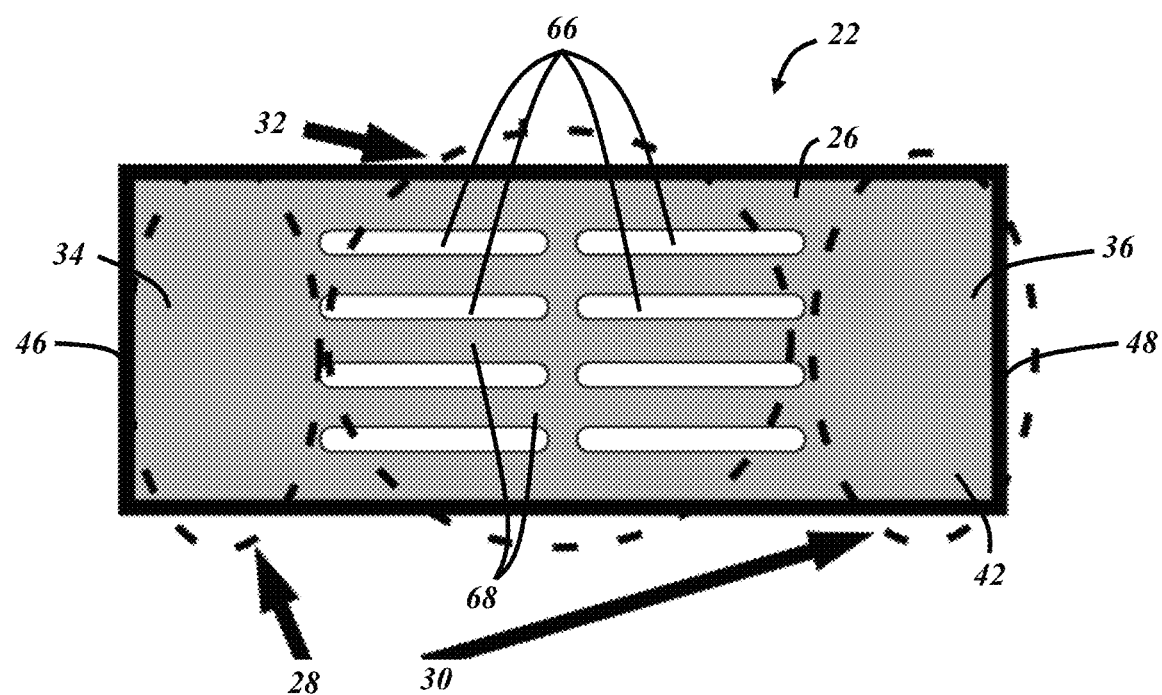
FIG. 12 is a top view of another embodiment of a resonator.
Figure 13:
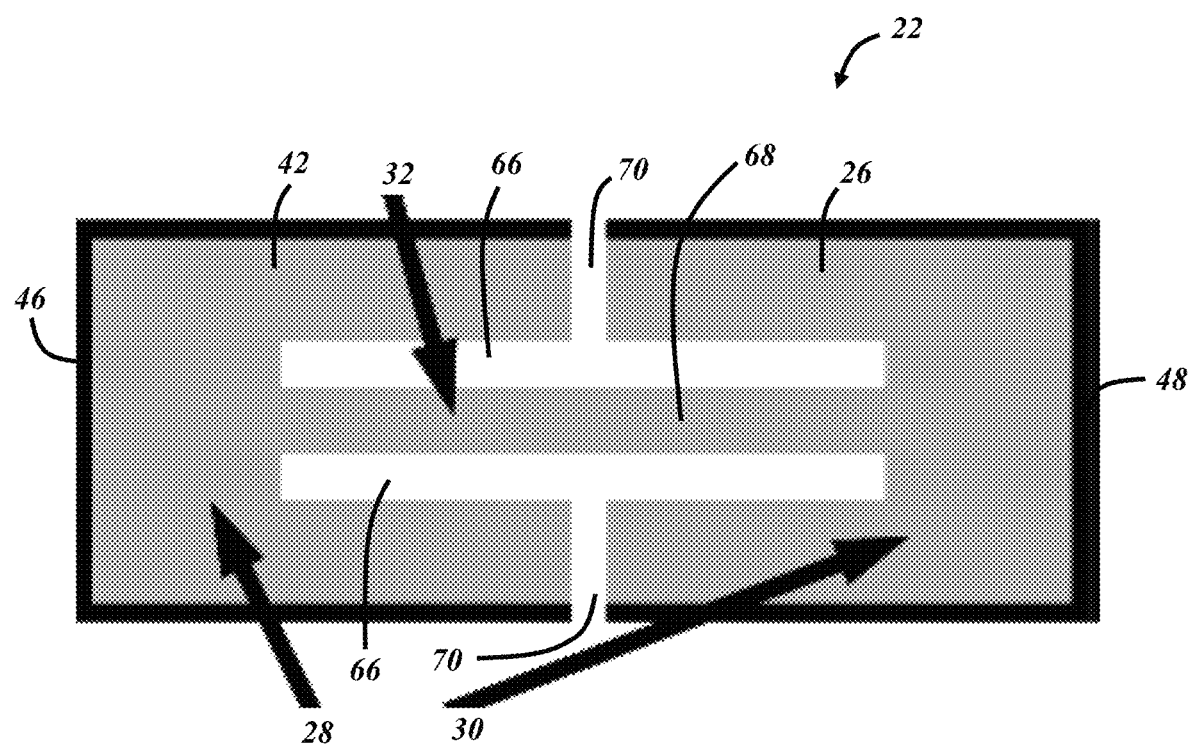
FIG. 13 is a top view of yet another embodiment of a resonator.
Figure 14:
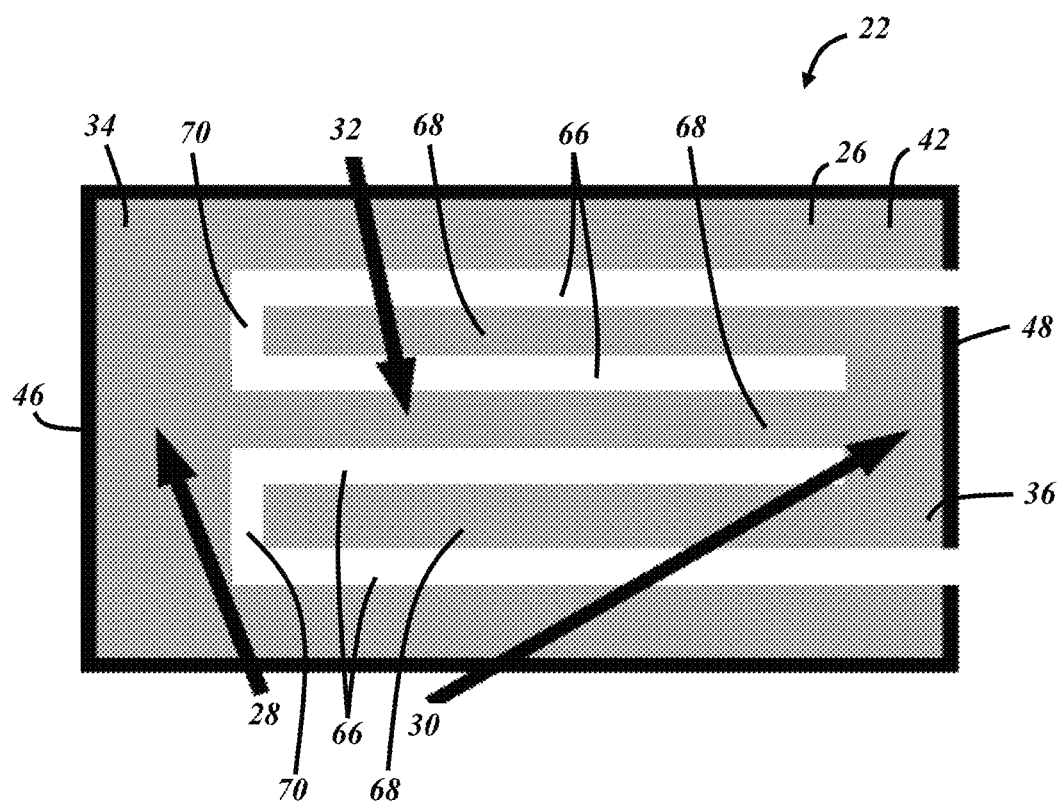
FIG. 14 is a top view of yet another embodiment of a resonator.

A similar principle to that used and described with respect to the FIG. 11 embodiment can be used with the geometries shown in FIGS. 12-14. FIG. 12 is a perforated geometry having a plurality of longitudinal slots 66 in the active resonating portion 32, which create a plurality of internal resonating ribbons 68 (only a few of the slots 66 and ribbons 68 are labeled for clarity purposes. This structure results in a mass loading effect at the mass load portions 28, 30 by having unperforated or unslotted areas at the ends 46, 48. FIG. 13 is a slotted geometry where the longitudinal slots 66 are joined by transverse slots 70 to create one centrally located internal resonating ribbon 68. In this embodiment, use of the longitudinal slots 66 and the transverse slots 70 in a rectangular geometry creates a narrow central active resonating portion 32 which is surrounded by effective masses 34, 36 at the mass load portions 28, 32. FIG. 14 is a nested geometry where the transverse slots 70 are located completely within the body 26. In this embodiment, two of the longitudinal slots 66 extend all the way to the second end 48. The structure of the slots 66, 70 within the rectangular geometry, like the embodiment shown in FIG. 13, creates a narrow central active resonating portion 32 surrounded by nested masses 34, 36 at the mass load portions 28, 30. The longitudinal slots 66 run along the long edge of the body 26, whereas the transverse slots 70 run along the short edges or ends 46, 48 of the body.

Methods of Manufacture—

Figure 15:
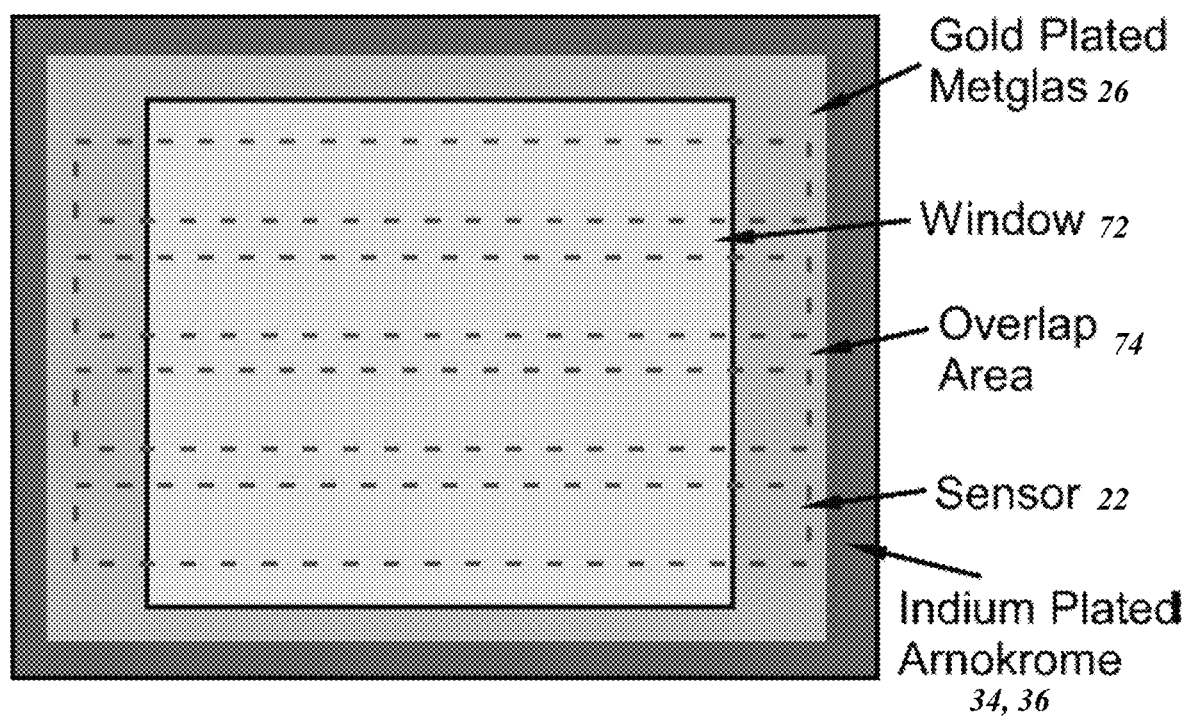
FIG. 15 is a top view of a partially manufactured resonator in accordance with one manufacturing method.

Various manufacturing methods may be used to create the resonators 22, one of which is schematically illustrated in FIG. 15. In one particular method, two METGLAS sheets are bonded for the magnetoelastic body 26 and two ARNOKROME sheets are bonded for the masses 34, 36, using a gold-indium (Au—In) eutectic bonding process. After this initial bonding process, one surface of the bonded METGLAS layers is electroplated by 6 μm gold. For the ARNOKROME layers, a window feature 72 is machined using electrical discharge machining (EDM), and then one side of the ARNOKROME is electroplated by 6 μm indium. The two layers are bonded together with the same Au—In eutectic bonding process to create the overlap area 72 outboard of the window 70. In another embodiment, such as to manufacture the resonator 22 of FIG. 1, the METGLAS sheets can be sandwiched between two ARNOKROME assemblies, each having matching window features. Finally, the resonators or sensors 22 are machined using EDM form the bonded layer assembly, as shown in dotted lines in FIG. 15.

In another manufacturing method embodiment, for example, the magnetic ARNOKROME material is replaced with another metal, with balls of solder, with a thermoplastic polymer, or with a thermoset polymer (e.g., an epoxy), to cite a few examples. In general, these alternatives would only provide the mass loading to reduce the resonant frequency; they would not generally be capable of providing the DC bias to the resonator 22. Metals could be attached with other methods besides solder-bonding, for instance: welding, thermocompression bonding, or epoxy bonding, to cite a few examples.

For other materials, it may be more economical to use an attachment approach that does not require defined (solid) mass loads. For example, the ends 46, 48 of the resonator 22 could be dipped in molten (or uncured) materials like solder, thermoplastic polymers, thermoset polymers, waxes, etc. Upon removal of the resonator 22 from the molten/uncured material, the liquid material that has coated the resonator end would solidify or cure in place, and then act as the mass 34-40 as described herein. In this attachment approach, the liquid material could be "guided" to its desired location, and provided more anchoring surface area at that location, by locally perforating or grooving the resonator, as shown in the embodiment illustrated in FIG. 4, which has the anchoring perforations 50, 52. Note also that this dip and cure attachment process could utilize molten materials loaded with magnetic particles, thus achieving both mass-loading and self-biasing properties.

It is to be understood that the foregoing description is of one or more preferred example embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A resonator, comprising:
a magnetoelastic body having a mass load portion and an active resonating portion; and
a mass at the mass load portion of the magnetoelastic body,
wherein displacement of the magnetoelastic body is configured to occur at both the mass load portion and the active resonating portion, and
wherein a strain at the active resonating portion during displacement is configured to be greater than a strain at the mass load portion during displacement, wherein a size of the mass is correlated with a size of the magnetoelastic body, wherein the size of the mass is at least partially dependent on a mass add ratio, the mass add ratio being equal to $M_{add}/M_0$, wherein $$M_{add}=4*t_m*L_m*w*\rho$$

wherein, $$M_0=t_b*L_b*w*\rho$$

and wherein $t_m$ is a thickness of the mass, $L_m$ is a length of the mass, w is a width of the mass, $\rho$ is a density of the magnetoelastic body, $t_b$ is a thickness of the magnetoelastic body, and $L_b$ is a length of the magnetoelastic body.

2. The resonator of claim 1, wherein a length of the magnetoelastic body is in a range from 8.25 mm to 12.5 mm, inclusive.

3. The resonator of claim 1, wherein the size of the mass is at least partially dependent on a miniaturization factor of the magnetoelastic body.

4. The resonator of claim 3, wherein the miniaturization factor is a length of an unloaded magnetoelastic body configured to have an unloaded resonant frequency divided by a length of the magnetoelastic body configured to have a loaded resonant frequency that is within 1 kHz of the unloaded resonant frequency.

5. The resonator of claim 4, wherein the miniaturization factor is in a range from 1.5 to 4.2, inclusive.

6. The resonator of claim 4, wherein a thickness of the mass or an area of the mass load portion increases as the miniaturization factor increases.

7. The resonator of claim 4, wherein the unloaded resonant frequency is between 50 kHz and 60 kHz, inclusive.

8. The resonator of claim 3, wherein the miniaturization factor is at least partially dependent on a width of the active resonating portion and a width of the mass.

9. The resonator of claim 8, wherein the width of the mass is equal to a width of the mass load portion.

10. The resonator of claim 1, wherein the mass is a separate mass element coupled to the magnetoelastic body at the mass load portion.

11. The resonator of claim 10, wherein the separate mass element provides a DC magnetic bias.

12. The resonator of claim 10, further comprising a second separate mass element in addition to the first separate mass element.

13. The resonator of claim 12, wherein the first separate mass element is coupled to a first end of the magnetoelastic body and the second separate mass element is coupled to a second end of the magnetoelastic body, with the active resonating portion located between the first separate mass element and the second separate mass element.

14. The resonator of claim 10, wherein the separate mass element extends through an anchoring perforation in the magnetoelastic body.

15. The resonator of claim 1, wherein the active resonating portion includes one or more internal resonating ribbons separated by a plurality of longitudinal slots.

16. The resonator of claim 15, wherein a transverse slot joins to one or more of the longitudinal slots of the plurality of longitudinal slots.

17. A resonator, comprising:
a magnetoelastic body having a mass load portion and an active resonating portion; and
a mass at the mass load portion of the magnetoelastic body,
wherein displacement of the magnetoelastic body is configured to occur at both the mass load portion and the active resonating portion, and
wherein a strain at the active resonating portion during displacement is configured to be greater than a strain at the mass load portion during displacement, wherein the mass is a separate mass element coupled to the magnetoelastic body at the mass load portion, and further comprising a second separate mass element in addition to the first separate mass element, wherein the first separate mass element is coupled to a first end of the magnetoelastic body and the second separate mass element is coupled to a second end of the magnetoelastic body, with the active resonating portion located between the first separate mass element and the second separate mass element, wherein a third separate mass element is coupled to the first end of the magnetoelastic body, on an opposite side of the magnetoelastic body as the first separate mass element, and wherein a fourth separate mass element is coupled to the second end of the magnetoelastic body, on the opposite side of the magnetoelastic body as the second separate mass element.

18. A security tag, comprising:
a housing; and
a resonator, the resonator comprising:
a magnetoelastic body having a mass load portion and an active resonating portion; and
a mass at the mass load portion of the magnetoelastic body, wherein displacement of the magnetoelastic body is configured to occur at both the mass load portion and the active resonating portion, and wherein a strain at the active resonating portion during displacement is configured to be greater than a strain at the mass load portion during displacement, the resonator being located in the housing, wherein the resonator is not anchored to the housing.

19. A method of manufacturing a resonator, comprising the steps of:

correlating a size of a mass with a size of a magnetoelastic body, wherein the size of the mass is at least partially dependent on a miniaturization factor of the magnetoelastic body, wherein the miniaturization factor is a length of an unloaded magnetoelastic body configured to have an unloaded resonant frequency divided by a length of the magnetoelastic body configured to have a loaded resonant frequency that is within 1 kHz of the unloaded resonant frequency; and coupling the mass to the magnetoelastic body at a mass load portion of the magnetoelastic body.

* * * * *